United States Patent
Lee et al.

(10) Patent No.: US 8,623,455 B2
(45) Date of Patent: Jan. 7, 2014

(54) MULTIPLE VACUUM EVAPORATION COATING DEVICE AND METHOD FOR CONTROLLING THE SAME

(75) Inventors: Sung-Ho Lee, Yongin (KR); Su-Hwan Kim, Yongin (KR); Min-Jeong Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/215,434

(22) Filed: Aug. 23, 2011

(65) Prior Publication Data

US 2011/0305834 A1    Dec. 15, 2011

Related U.S. Application Data

(62) Division of application No. 11/370,033, filed on Mar. 8, 2006, now Pat. No. 8,025,735.

(30) Foreign Application Priority Data

Mar. 9, 2005 (KR) .................. 10-2005-0019645

(51) Int. Cl.
   *C23C 16/00* (2006.01)
(52) U.S. Cl.
   USPC .................. 427/248.1; 118/726; 118/727
(58) Field of Classification Search
   None
   See application file for complete search history.

(56) References Cited

U.S. PATENT DOCUMENTS

| 3,025,043 | A | 3/1962 | Ruelle et al. |
|---|---|---|---|
| 3,846,254 | A | 11/1974 | Sephton |
| 4,368,877 | A | 1/1983 | Baumert |
| 4,565,158 | A | 1/1986 | Koprio |
| 4,915,723 | A | 4/1990 | Kaneko et al. |
| 5,803,976 | A | 9/1998 | Baxter et al. |
| 5,991,328 | A | 11/1999 | Choudhury et al. |
| 6,049,559 | A | 4/2000 | Abiko et al. |
| 6,101,316 | A | 8/2000 | Nagashima et al. |
| 6,322,745 | B1 * | 11/2001 | Leigh et al. .................. 266/44 |
| 2001/0006105 | A1 * | 7/2001 | Watanabe et al. ............. 165/177 |

(Continued)

FOREIGN PATENT DOCUMENTS

| JP | 53-026282 | 3/1978 |
|---|---|---|
| JP | 60-32361 U | 3/1985 |

(Continued)

OTHER PUBLICATIONS

Korean Office Action for Korean Patent Application No. 2005-0019645 dated Aug. 23, 2006.

(Continued)

*Primary Examiner* — Joseph Miller, Jr.
(74) *Attorney, Agent, or Firm* — Robert E. Bushnell, Esq.

(57) ABSTRACT

A multiple vacuum evaporation coating device and a method for controlling the same. The vacuum evaporation coating device includes a plurality of evaporation sources, a rotating part adapted to rotate the plurality of evaporation sources and a coating block plate adapted to block all but one of said plurality of evaporation sources at any time, each of the plurality of evaporation sources comprise a case, a melting pot arranged within said case, an evaporation material arranged within the melting pot, a heating device arranged outside the melting pot and adapted to heat and evaporate the evaporation material, and a cooling device adapted to block heat generated by the heating device from transferring to an outside.

17 Claims, 4 Drawing Sheets

(56) References Cited

U.S. PATENT DOCUMENTS

| | | |
|---|---|---|
| 2002/0040682 A1* | 4/2002 | Ramsay .................. 118/723 EB |
| 2002/0179013 A1 | 12/2002 | Kido et al. |
| 2003/0221620 A1 | 12/2003 | Yamazaki |
| 2004/0123804 A1 | 7/2004 | Yamazaki et al. |
| 2004/0139914 A1* | 7/2004 | Yamazaki et al. ............ 118/719 |
| 2004/0195965 A1 | 10/2004 | Yamazaki et al. |
| 2005/0000406 A1 | 1/2005 | Janzen et al. |

FOREIGN PATENT DOCUMENTS

| | | |
|---|---|---|
| JP | 01-198467 | 8/1989 |
| JP | 2000-160328 | 6/2000 |
| JP | 2001-058266 | 3/2001 |
| JP | 2003-313657 | 11/2003 |
| KR | 2003-0015096 | 2/2003 |
| TW | 495555 | 7/2002 |
| TW | 557640 | 10/2003 |

OTHER PUBLICATIONS

Taiwanese Search Report issued on May 17, 2007, corresponding to Taiwanese Patent Application No. 093117616.

TELEMARK model 231 series, multi-pocket E-gun family, catalog p. 56.

Office action issued by Chinese Patent Office on Aug. 29, 2008 corresponding to Chinese Patent Application No. 200610091638.6.

Japanese Office action issued on Mar. 17, 2009 corresponding to Japanese Patent Application No. 2005-361051.

* cited by examiner

MULTIPLE VACUUM EVAPORATION COATING DEVICE AND METHOD FOR CONTROLLING THE SAME

CROSS-REFERENCE TO RELATED APPLICATIONS AND CLAIM OF PRIORITY

This application is a divisional of Applicant's Ser. No. 11/370,033, now U.S. Pat. No. 8,025,735, and entitled MULTIPLE VACUUM EVAPORATION COATING DEVICE AND METHOD FOR CONTROLLING THE SAME filed in the U.S. Patent & Trademark Office on 8 Mar. 2006 and issued on 27 Sep. 2011, and assigned to the assignee of the above-captioned application. Furthermore, this application makes reference to, incorporates the same herein, and claims all benefits accruing under 35 U.S.C. §119, §120 and/or §121 from the aforesaid U.S. Pat. No. 8,025,735 and from an application for DEVICE AND METHOD FOR VACUUM PLATING BY MULTIPLE EVAPORATION earlier filed in Korean Intellectual Property Office on 9 Mar. 2005 and there duly assigned Ser. No. 10-2005-0019645.

BACKGROUND OF THE INVENTION

1. Field of the Invention

The present invention relates to a multiple vacuum evaporation coating device and a method for controlling the same, and more particularly to, a device and a method having a cooling device blocking the spread of heat while being able to control the rotation angle of the evaporation devices.

2. Description of the Related Art

Generally, an organic light emitting diode (OLED) display device has an indium tin oxide (ITO) anode, a metal cathode and an organic thin film multi-layer between the anode and the cathode. The organic thin film multi-layer can also have an ETL (Electron Transport Layer), an HTL (Hole Transport Layer) and an EML (Emitting Layer). The organic thin film multi-layer can also have an EIL (Electron Injecting Layer), an HIL (Hole Injecting Layer) or an HBL (Hole Blocking Layer) additionally inserted for the improvement of features of elements.

A typical OLED vacuum evaporation coating device used for forming organic thin film multi-layers generally performs the processes as follows. The first process is an ITO thin film evaporation coating process by vacuum evaporating several ITO thin film patterns on the surface of the glass substrate by sputtering. Then, as the prior process of ITO thin film, it is discharged so that the hole from ITO used for the positive pole can easily move to the emitting layer, and the surface is oxidized by using ultraviolet rays or a plasma. After that, in the organic thin film evaporation coating process, for example, by using the vacuum evaporation coating method in a high-degree vacuum state, the organic films are formed on the surface of the glass substrate. The structure of the vacuum chamber where these thin films are coated includes an evaporation source of materials, a sensor controlling the thickness of the film, a device aligning a glass substrate to the metal shadow masks, and a power source for evaporating materials. After the evaporation coating of these organic thin films is complete, the evaporation coating of metal electrodes, the evaporation coating of protective films, and the pack process are performed in order.

In this process, the evaporation coating device used in evaporation coating thin films is formed so that by heating organic and inorganic material, the material can be coated on a board installed inside the vacuum chamber. Various kinds of evaporation coating devices have been developed. The multiple vacuum evaporation coating device is used so that several evaporation sources can be rotated, and when the evaporation source is positioned at a location for heating, the melting pot is heated by a heating device. In this arrangement, the evaporation source is formed so that the melting pot having the evaporation materials can be heated by the heating device. The location for heating the melting pot includes a main heating position for evaporation coating and the preliminary heating position for heating the melting pot before being moved to the main heating position.

One drawback with this multiple evaporation coating device arrangement is that heat radiated from the melting pot was often transferred to the nearby melting pots, causing evaporation coating materials in the nearby the melting pots to discharge. Further, because the position of the main heating and the position of the preliminary heating were located far from each other, efficiency of preliminary heating was low. What is therefore needed is a multiple evaporation coating device that overcomes both these problems.

SUMMARY OF THE INVENTION

It is therefore an object of the present invention to provide an improved multiple evaporation coating device.

It is also an object of the present invention to provide a multiple evaporation coating device where heat generated in one of the devices does not warm up the other devices.

It is further an object of the present invention to provide a multiple evaporation coating device to have improved preliminary heating efficiency.

It is yet an object of the present invention to provide an improved method of operating a multiple evaporation coating device.

It is still an object of the present invention to provide a multiple vacuum evaporation coating device and a method for controlling the same that can prevent the transfer of heat generated to the nearby evaporation sources by installing a reflector blocking and cooling the heat generated from the heating device and the melting pot and a cooling device having low-temperature water on the evaporation source while improving upon the efficiency of the preliminary heating by controlling the rotation of the evaporation source and locating the position for main heating close to the location of the preliminary heating.

These and other object can be achieved by a vacuum evaporation device that includes a plurality of evaporation sources, a rotating part adapted to rotate the plurality of evaporation sources, and a coating block plate adapted to block all but one of said plurality of evaporation sources at any time, each of the plurality of evaporation sources comprise a case, a melting pot arranged within said case, an evaporation material arranged within the melting pot, a heating device arranged outside the melting pot and adapted to heat and evaporate the evaporation material, and a cooling device adapted to block heat generated by the heating device from transferring to an outside.

The cooling device can include at least one reflector, the at least one reflector being adapted to cover the heating device. The case can have a dual structure that includes an inner wall, outer wall and a closed space between the inner wall and the outer wall, the case being adapted to supply and discharge cooling water into and out of the closed space.

The vacuum evaporation device can further include upper and lower blocking parts arranged at upper and lower portions of the inner and the outer walls respectively, the upper and the lower blocking parts being adapted to close off the closed space. The supply pipe and the discharge pipe can be arranged at upper and the lower parts respectively of the outer wall. The vacuum evaporation device can further include a bulkhead arranged within the closed space and adapted to isolate the supply pipe from the discharge pipe, the bulkhead being arranged near each of the supply pipe and the discharge pipe.

The supply pipe and the discharge pipe can be arranged at the lower and the upper parts respectively of the outer wall, and the supply pipe and the discharge pipe can be arranged to be symmetric with each other about the case. The vacuum evaporation device can further include at least one cooling inductive pipe arranged between the supply pipe and the discharge pipe within the closed spaced. The vacuum evaporation coating device can further include a cooling cover that is adapted to block an upper part of the cooling source opened between the melting pot and the case, the cooling cover being supported by the case and extending to the melting pot. The rotating part can be adapted to rotate the plurality of evaporation sources, each heating device can include a first heating device adapted to heat adapted for a main heating for evaporation and a second heating device adapted for a preliminary heating.

According to another aspect of the present invention, a method of operating a vacuum evaporation coating device can include providing an evaporation coating device comprising a plurality of evaporation sources; a rotating part adapted to rotate the plurality of evaporation sources; and a coating block plate adapted to block all but one of said plurality of evaporation sources at any time, each of the plurality of evaporation sources comprise a case, a melting pot arranged within said case, an evaporation material arranged within the melting pot, a heating device arranged outside the melting pot and adapted to heat and evaporate the evaporation material, and a cooling device adapted to block heat generated by the heating device from transferring to an outside, heating said one of said plurality of evaporation sources not blocked by said coating block plate while preliminarily heating an adjacent one of said plurality of evaporation sources, rotating the plurality of evaporation sources by an angle θ so that said adjacent one of said plurality of evaporation sources is no longer blocked by said coating block plate, said angle θ being equal to $=360°\times((t-1)/s)$ where t and s satisfy $0<((t-1)/s)\leq1.0$ and where s is the total number of evaporation sources, t is a natural number, and 360° is the angle acquired when $n^{th}$ evaporation is rotated one time. s can be ≥2. T and s can satisfy the inequality $1<t\leq s$. Among the evaporation sources, the $n^{th}$ evaporation source is heated by the first heating device, and wherein the $(n-1)^{th}$ evaporation source is heated by the second heating device.

According to still another aspect of the present invention, an evaporation coating device can include a plurality of evaporation sources, a rotating part adapted to rotate the plurality of evaporation sources and a coating block plate adapted to block all but one of said plurality of evaporation sources at any time, each of the plurality of evaporation sources comprise a case, a melting pot arranged within said case, an evaporation material arranged within the melting pot, a heating device arranged outside the melting pot and adapted to heat and evaporate the evaporation material, and a cooling device arranged outside the heating device and adapted to prevent heat generated by the heating device from passing therethrough.

The cooling device can include at least one reflector adapted to reflect heat generated by the heating device and traveling in a direction of the cooling device. The cooling device can include a first reflector and a second reflector arranged at an outside of the first reflector, each of the first reflector and the second reflector being adapted to reflect heat generated by the heating device and traveling in a direction of the cooling device. The cooling device can include a closed space filled with cooling water and arranged outside of the heating device. The cooling device can include a water supply pipe and a water discharge pipe connected to the closed space and adapted to deliver and remove cooling water from the closed space.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
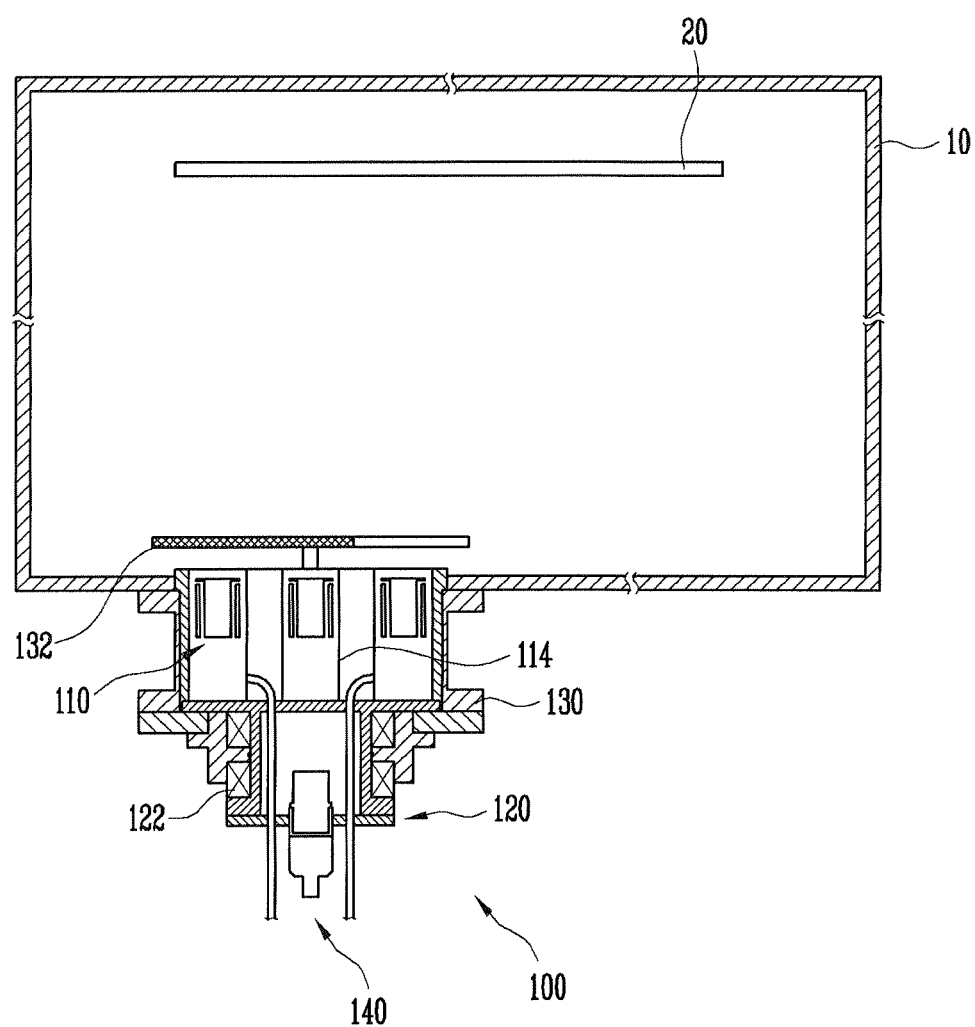
FIG. 1 is a sectional view roughly illustrating the vacuum evaporation coating device having multiple evaporation sources according to an embodiment of the present invention.

Turning now to the figures, FIG. 1 is a sectional view roughly illustrating the vacuum evaporation coating device 100 having multiple evaporation sources 110 according to an embodiment of the present invention. Referring to FIG. 1, a board 20 is installed in a vacuum chamber 10, and a evaporation coating device 100 is installed on the vacuum chamber 10 to allow for the evaporation coating of the evaporation coating materials. The evaporation coating device 100 includes several evaporation sources 110, a rotating part 120 on which the several evaporation sources 110 are mounted, a fixed housing 130 fixed to the vacuum chamber 10 allowing the rotating part 120 to rotate, and a power source part 140.

The evaporation sources 110 are arranged so that they can rotate 360° and so each evaporation source 110 forms the same angle with each other. In the rotating part 120 are several bearings 122 used for rotation, and a vacuum sealing should be present to prevent damage to the vacuum state of the rotating part 120.

An evaporation coating blocking plate 132 is installed on the upper part of the fixed housing 130 so that evaporation coating materials discharged from non main heating evaporation sources 110 can be blocked. The evaporation coating blocking plate 132 forms an opening having a certain angle so that only the one evaporation source currently being subject to the main heating can discharge material into the vacuum chamber 10. The evaporation coating blocking plate is fixed at the fixed housing 130.

Figure 2:
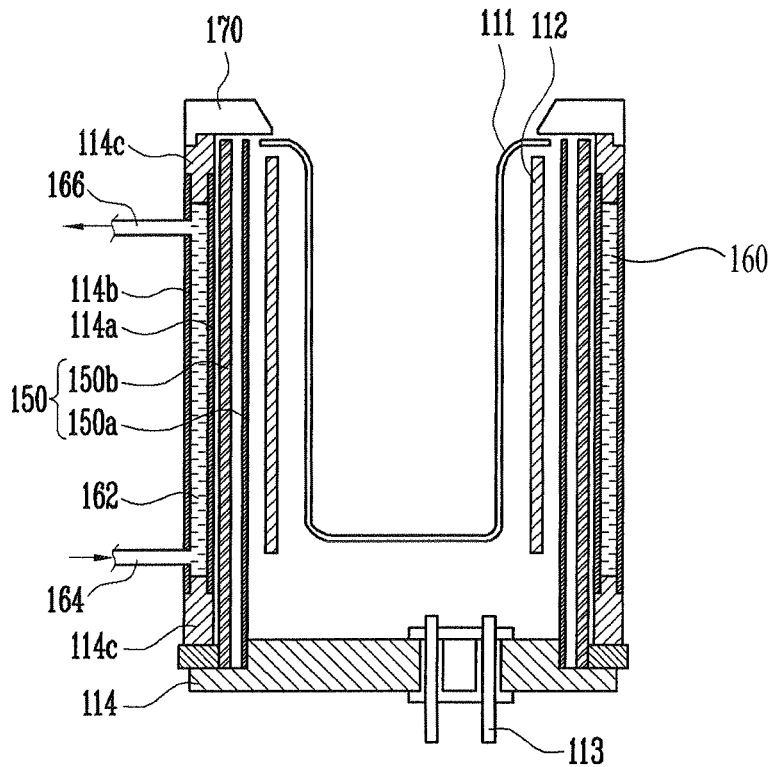
FIG. 2 is an enlarged sectional view illustrating one of the evaporation sources of the vacuum evaporation coating device illustrated in FIG. 1.

Turning now to FIG. 2, FIG. 2 is an enlarged sectional view illustrating one of the evaporation sources 110 of FIG. 1. Referring to FIG. 2, an evaporation source 110 includes a melting pot 111, a heating device 112 located at the outer side of the melting pot 111 for heating the melting pot 111, a power terminal 113 for connecting the heating device 112 to the power source part 140, a case 114 where the power terminal 113 is installed, and a cooling device preventing heat generated by the melting pot 111 and the heating device 112 from being transferred to the outside.

The cooling device includes a reflector 150 covering the heating device 112 in order to block the heat from the heating device 112 and the melting pot 111 from escaping. The cooling device also includes a closed space 160 having an inflow and an outflow for the cooling water 162, the closed space 160 and the cooling water 162 being within case 114 between inner wall 114a and outer wall 114b.

The reflector 150 is preferably made up of several units, including first reflector 150a that reflects the high-temperature heat emanating from the heating device 112 and from the melting pot 111. First reflector 150a is located near the heating device 112. Reflector 150 also includes second reflector 150 that also reflects high-temperature heat that transmits through the first reflector 150a.

The first and second reflectors 150a and 150b are preferably formed to having some space between each other. Further, the first and second reflectors 150a and 150b are preferably located in a space between the heating device 112 and the inner wall 114a of case 114. Reflector 150 serves to prevent the unwanted transfer of heat to an outside of the evaporation source.

Closed space 160 is preferably sealed by installing blocking materials 114c on the upper and the lower parts of the inner wall 114a and the outer wall 114b. Blocking materials 114c can be sealed to the inner wall 114a and the outer wall 114b of the case 114. Case 114 has the dual wall structure, and within this dual structure is the closed space 160.

A supply pipe 164 and a discharge pipe 166 are installed at the lower part and the upper part respectively of the outer wall 114b. Supply pipe 164 and discharge pipe 166 are connected to the closed space 160 so that the cooling water 162 can be supplied to and removed from the closed space 160. It is preferable that the supply pipe 164 is connected to the supply water tank (not shown) located outside, and a separate pump (not shown) is arranged for supplying the cooling water 162 to the closed space 160 via the supply pipe 164. The discharge pipe 166 is also preferably connected to the discharge water tank (not shown). Another pump (not shown) can be installed to remove cooling water 162 from closed space 160 to the tank via the discharge pipe 166.

A cooling cover 170 is also included to block heat escaping from the upper end of the evaporating source 110 at the opening between the upper side of the melting pot 111 and the inner wall 114a. The cooling cover 170 is preferably extended to the end part of the melting pot 111 and is supported by the upper blocking materials 114c. The cooling cover 170 can be made of the same material as the reflector 150, or can be made of some other insulating material.

Figure 3:
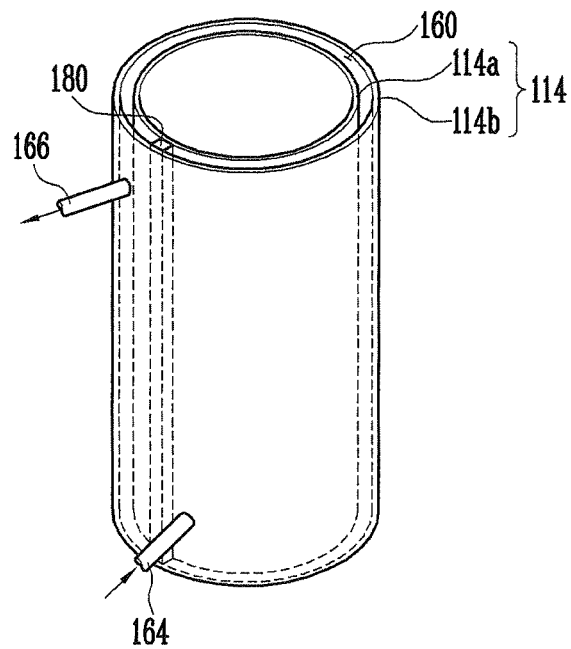
FIGS. 3 through 5 are variations of cooling devices of the evaporations sources of FIG. 2.
Figure 4:
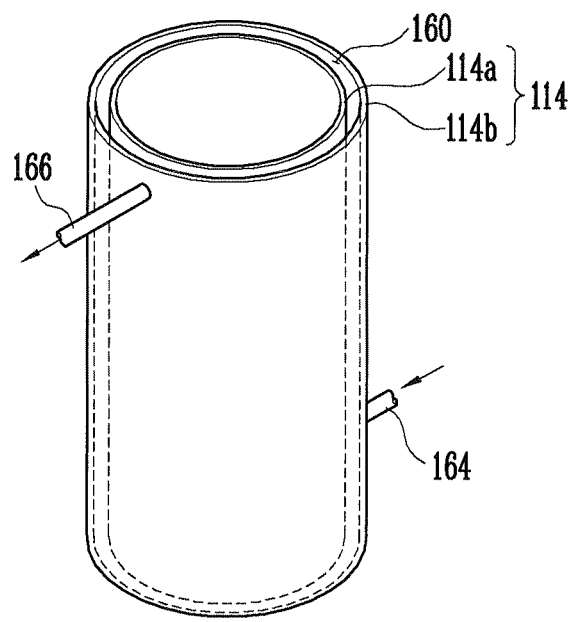
Figure 5:
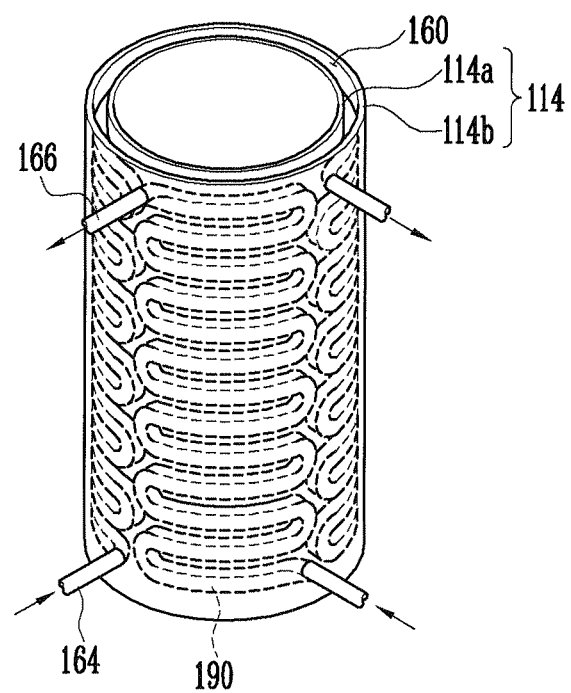

Turning now to FIGS. 3 through 5, FIGS. 3 through 5 illustrate variations of the cooling device of FIG. 2. Referring to FIG. 3, a bulkhead 180 is arranged within closed space 160 so that the supply pipe 164 and the discharge pipe 166 can be further separated from each other. The supply pipe 164 and the discharge pipe 166 are preferably located on opposite sides of the bulkhead 180. This structure allows water supplied by supply pipe 164 to become heated before being discharged from the closed space 160 by discharge pipe 166.

Referring now to FIG. 4, the supply pipe 164 and the discharge pipe 166 are located at opposite sides of case 114 diametrically opposite from each other. The purpose of this arrangement of FIG. 4 is to discharge the cooling water 162 via discharge pipe 166 only after the cooling water 162 has had a chance to sufficiently move throughout the closed space 160 after being supplied by the supply pipe 164.

Referring now to FIG. 5, the cooling device further includes one or more inductive pipes 190 arranged within the closed space 160. In FIG. 5, it is preferable that more than one inductive pipe 190 is used so that the range of the heat absorption can be reduced. Preferably, the inductive pipes 190 are arranged so that one end is located at an upper end of closed space 160 and is attached to a discharge pipe 166 while the other end of each inductive pipe 190 is located at a lower end of the closed space 160 and is attached to a supply pipe 164.

Figure 6:
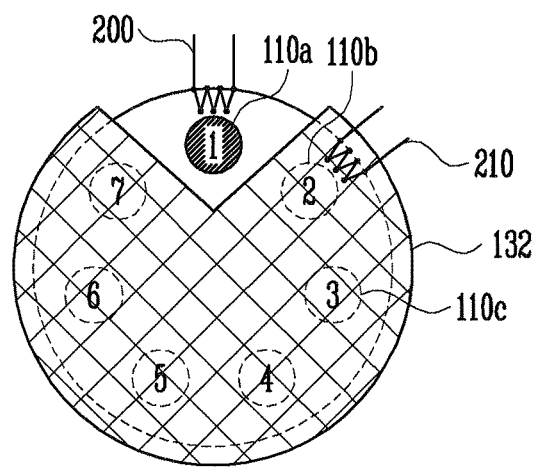
FIG. 6 is a plane figure of the evaporation coating device illustrated in FIG. 1.
Figure 7:
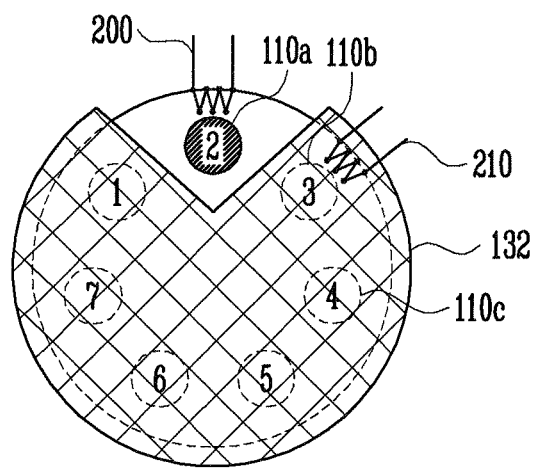
FIG. 7 illustrates a rotated state of the evaporation coating device of FIG. 6.

Turning now to FIGS. 6 and 7, the control method of the vacuum evaporation coating device having multiple evaporation sources vis a vis the evaporation coating blocking plate 132 and the main and the preliminary heaters is illustrated. FIG. 6 is the plane figure of the evaporation coating device illustrated in FIG. 1, and FIG. 7 is the plane figure illustrating the state in which the evaporation source of FIG. 6 moved to the next process. FIG. 6 shows the initial position and FIG. 7 shows the position of the evaporation sources after being rotated one position.

Referring to FIG. 6, several evaporation sources 110 with cooling devices within are arranged so that they can rotate 360° by rotating part 120. The rotating part 120 is attached to the evaporation sources 110 and to the power source part 140 that provides rotating power to the rotating part 120. A control part measures and controls the rotation angle of the rotating part 120 by the rotating power of the power source part 140. The rotating part 120 is a device generally installed in the rotation-type evaporation coating device 100, and the detailed explanations are omitted here.

An evaporation coating blocking plate 132 allows for the discharge of only the evaporation source 110a being heated by the main heating, and blocks the discharge of the other remaining evaporation coating sources 100b, 100c, ..., . Thus it is only the evaporation coating materials of the evaporation source 110a heated by the main heating device 200 that is allowed to coat the board 20 of FIG. 1.

The location where the evaporation source 110a is heated by the first (main) heating device 200 and the location where the evaporation source 110b is heated by the second (preliminary) source 210 are set. The first and second heating devices 200, 210 are arranged close each other as in FIGS. 6 and 7.

As illustrated in FIG. 6, the first evaporation source 110a is heated by the first (main) heating device 200 to allow for evaporation coating. At a location near the evaporation source heated by the main heating 110a is the second evaporation source 110b that is heated by the second (preliminary) heating device 210. In this way, one process completed.

In other words, the $n^{th}$ evaporation source 110a among several evaporation sources having cooling devices is heated by the first (main) heating device 200, and the $(n-1)^{th}$ evaporation source 110b waits for the main heating while being heated by the second (preliminary) heating device 210. When the evaporation coating of $n^{th}$ evaporation source 110a heated by the main heating device 200 is completed, the $(n-1)^{th}$ evaporation source 110b heated by the preliminary heating device 210 is moved to the main heating location so that it can be heated by the first (main) heating device 200 as in FIG. 7. As this occurs, the $(n-2)^{th}$ evaporation source 110c of FIG. 6 is moved to the location of the preliminary heating device 210 in FIG. 7. Thus, FIG. 7 illustrates the result of one incremental rotation of rotating part 120.

When one process of the evaporation source 110 is completed, if the rotation of the evaporation source 110 is expressed by Equation 1, the rotation angle θ rotated by the rotating device for one process can be expressed as follows where s is the total number of evaporation sources, and 360° is the angle when $n^{th}$ evaporation source is rotated one time:

$$\theta = 360° \times ((t-1)/s) \qquad \text{[Equation 1]}$$

Here, the equation 1 should satisfy $0 < (t-1)/s \leq 1.0$.

Where s, the total number of evaporation sources should satisfy $s \geq 2$.

And t, a natural number should satisfy $1 < t \leq s$.

Likewise, the reason why the location of the main heating and the location of the preliminary heating should be close each other is because the high-temperature heat discharged from the evaporation sources 110a and 110b can be blocked and cooled off by installing a cooling device for each evaporation source 110.

According the present invention described above, because the high-temperature heat generated from the evaporation sources heated by the main and the preliminary heating is prevented from being transferred to nearby evaporation sources, the discharge of the evaporation coating materials by heating evaporation sources except at the evaporation source heated by the main heating is significantly reduced. Also, since the location of the main heating and the location of the preliminary heating are close to each other, there is an increase in the efficiency in the utilization of the preliminary heating device according to its original purpose.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A method of controlling an evaporation coating device, comprising the steps of:
   providing an evaporation coating device including a plurality of evaporation sources, a rotating part adapted to rotate the plurality of evaporation sources, and a coating block plate adapted to block all but one of said plurality of evaporation sources at any time, wherein each of the plurality of evaporation sources comprises a case, a melting pot arranged within said case, an evaporation material arranged within the melting pot, and a heating device arranged outside the melting pot and adapted to heat and evaporate the evaporation material;
   heating said one of said plurality of evaporation sources not blocked by said coating block plate while preliminarily heating an adjacent one of said plurality of evaporation sources;
   rotating the plurality of evaporation sources by an angle θ so that said adjacent one of said plurality of evaporation sources is no longer blocked by said coating block plate, said angle θ being equal to $360° \times ((t-1)/s)$ where t and s satisfy $0 < ((t-1)/s) \leq 1.0$, and where s is a total number of evaporation sources, t is a natural number, and 360° is the angle acquired when $n^{th}$ evaporation is rotated one time,
   wherein the case has a dual structure comprising an inner wall, an outer wall and a closed space between the inner wall and the outer wall, the case having a plurality of cooling inductive pipes arranged in a serpentine manner within the closed space for supplying cooling water to the closed space, each cooling inductive pipe of said plurality of cooling inductive pipes being confined to a portion of the closed space and having its own supply pipe for supplying cooling water and its own discharge pipe for discharging water that has absorbed heat,
   wherein each of the cooling inductive pipes of the plurality cooling inductive pipes has at least four "U" shaped turns, wherein the supply pipe and the discharge pipe are on opposite ends of a top and a bottom of the case, and wherein the plurality cooling inductive pipes entirely cover an interior of the case.

2. The method of claim 1, wherein $s \geq 2$.

3. The method of claim 1, wherein $1 < t \leq s$.

4. The method of claim 1, wherein, among the evaporation sources, the $n^{th}$ evaporation source is heated by a first heating device, and the $(n-1)^{th}$ evaporation source is heated by a second heating device.

5. The method of claim 1, wherein the cooling inductive pipes are used to prevent heat generated by the heating device of each evaporation source from being transferred to an outside.

6. The method of claim 1, the cooling inductive pipes to surround the heating device in each of the evaporation sources.

7. A method of controlling an evaporation coating device, comprising:
   providing an evaporation coating device including a plurality of evaporation sources, a rotating part adapted to rotate the plurality of evaporation sources, and a coating blocking plate adapted to block all but one of said plurality of evaporation sources at any time, wherein each of the plurality of evaporation sources comprises a case, a melting pot arranged within said case, an evaporation material arranged within the melting pot, and a heating device arranged outside the melting pot and adapted to heat and evaporate the evaporation material, and a cooling device adapted to block heat generated by the heating device from transferring to an outside, wherein the case has a dual structure comprising an inner wall, an outer wall and a closed space between the inner wall and the outer wall, the case having the cooling device comprised of a plurality of cooling inductive pipes arranged in a serpentine manner within the closed space for supplying cooling water to the closed space, each cooling inductive pipe of said plurality of cooling inductive pipes being confined to a portion of the closed space and having its own supply pipe for supplying cooling water and its own discharge pipe for discharging water that has absorbed heat;
   heating said one of said plurality of evaporation sources not blocked by said coating blocking plate while preliminarily heating an adjacent one of said plurality of evaporation sources; and
   rotating the plurality of evaporation sources by an angle θ so that said adjacent one of said plurality of evaporation sources is no longer blocked by said coating blocking plate, said angle θ being equal to $360° \times ((t-1)/s)$ where t and s satisfy $0 < ((t-1)/s) \leq 1.0$, and where s is a total number of evaporation sources, t is a natural number, and 360° is an angle acquired when an $n^{th}$ evaporation is rotated one time.

8. The method of claim 7, wherein the cooling device is external to and surrounds the heating device, and the heating device is interposed between the cooling device and the melting pot for each of the evaporation sources.

9. The method of claim 8, wherein each of the cooling inductive pipes of the plurality cooling inductive pipes has a plurality of "U" shaped turns, wherein the supply pipe and the discharge pipe are on opposite ends of a top and a bottom of the case, and wherein the plurality cooling inductive pipes entirely cover an interior of the case.

10. The method of claim 9, wherein the supply pipe and the discharge pipe are arranged at diametrically opposite sides of the case.

11. The method of claim 9, wherein the supply pipe and the discharge pipe are arranged on a same side of the case.

12. The method of claim 7, wherein the cooling device is used to prevent heat generated by the heating device of each evaporation source from being transferred to an outside.

13. The method of claim 7, wherein the cooling device surrounds the heating device in each of the evaporation sources.

14. A method of controlling an evaporation coating device, comprising:

providing an evaporation coating device including a plurality of evaporation sources, a rotating part adapted to rotate the plurality of evaporation sources, and a coating block plate adapted to block all but one of said plurality of evaporation sources at any time, wherein each of the plurality of evaporation sources comprises a case, a melting pot arranged within said case, an evaporation material arranged within the melting pot, and a heating device arranged outside the melting pot and adapted to heat and evaporate the evaporation material, wherein the case has a dual structure comprising an inner wall, an outer wall and a closed space between the inner wall and the outer wall, the case having a plurality of cooling inductive pipes arranged in a serpentine manner within the closed space for supplying cooling water to the closed space, each cooling inductive pipe of said plurality of cooling inductive pipes being confined to a portion of the closed space and having its own supply pipe for supplying cooling water and its own discharge pipe for discharging water that has absorbed heat;

heating said one of said plurality of evaporation sources not blocked by said coating block plate while preliminarily heating an adjacent one of said plurality of evaporation sources; and rotating the plurality of evaporation sources by an angle θ so that said adjacent one of said plurality of evaporation sources is no longer blocked by said coating block plate, said angle θ being equal to $360° \times ((t-1)/s)$ where t and s satisfy $0 < ((t-1)/s) \leq 1.0$, and where s is a total number of evaporation sources, t is a natural number, and 360° is an angle acquired when an $n^{th}$ evaporation is rotated one time.

15. The method of claim 14, wherein each cooling inductive pipe of said plurality of cooling inductive pipes being confined to a portion of the closed space and having its own supply pipe for supplying cooling water and its own discharge pipe for discharging water that has absorbed heat.

16. The method of claim 15, wherein each of the cooling inductive pipes of the plurality cooling inductive pipes has at least four "U" shaped turns, wherein the supply pipe and the discharge pipe are on opposite ends of a top and a bottom of the case, and wherein the plurality cooling inductive pipes entirely cover an interior of the case.

17. The method of claim 15, wherein the cooling device is external to and surrounds the heating device, and the heating device is interposed between the cooling device and the melting pot for each of the evaporation sources.

* * * * *